US008685827B2

(12) United States Patent
Kim et al.

(10) Patent No.: US 8,685,827 B2
(45) Date of Patent: Apr. 1, 2014

(54) METHOD OF FORMING POLYSILICON RESISTOR DURING REPLACEMENT METAL GATE PROCESS AND SEMICONDUCTOR DEVICE HAVING SAME

(75) Inventors: Ju Youn Kim, Suwon-si (KR); Jedon Kim, Seoul (KR)

(73) Assignee: Samsung Electronics Co., Ltd, Suwon-Si, Gyeonggi-Do (KR)

( * ) Notice: Subject to any disclaimer, the term of this patent is extended or adjusted under 35 U.S.C. 154(b) by 179 days.

(21) Appl. No.: 13/181,542

(22) Filed: Jul. 13, 2011

(65) Prior Publication Data
US 2013/0015530 A1     Jan. 17, 2013

(51) Int. Cl.
*H01L 21/20*     (2006.01)
(52) U.S. Cl.
USPC .......... 438/384; 438/379; 438/382; 438/383; 438/238
(58) Field of Classification Search
USPC .................. 438/380, 381, 382, 379, 383, 384
See application file for complete search history.

(56) References Cited

U.S. PATENT DOCUMENTS

| 6,074,921 A * | 6/2000 | Lin ............................... 438/299 |
| 7,949,821 B2 * | 5/2011 | Han ............................. 711/103 |
| 2010/0019344 A1 * | 1/2010 | Chuang et al. ............... 257/516 |
| 2011/0171810 A1 * | 7/2011 | Tseng et al. .................. 438/382 |

* cited by examiner

*Primary Examiner* — George Fourson, III
*Assistant Examiner* — Wilner Jean Baptiste
(74) *Attorney, Agent, or Firm* — F. Chau & Associates, LLC

(57) ABSTRACT

A method for manufacturing a semiconductor device, comprising forming a first gate stack portion on a substrate, the first gate stack portion including a first gate oxide layer and a first polysilicon layer on the first gate oxide layer, forming a second gate stack portion on the substrate, the second gate stack portion including a second gate oxide layer and a second polysilicon layer on the second gate oxide layer, forming a resistor portion on the substrate, the resistor portion including a third gate oxide layer and a third polysilicon layer on the third gate oxide layer, covering the resistor portion with a photoresist, removing respective first portions of the first and second polysilicon layers from the first and second gate stack portions, removing the photoresist from the resistor portion, and after removing the photoresist from the resistor portion, removing respective remaining portions of the first and second polysilicon layers from the first and second gate stack portions.

24 Claims, 16 Drawing Sheets

METHOD OF FORMING POLYSILICON RESISTOR DURING REPLACEMENT METAL GATE PROCESS AND SEMICONDUCTOR DEVICE HAVING SAME

BACKGROUND

1. Technical Field

The present disclosure relates to method of forming a polysilicon resistor during a replacement metal gate process, and a semiconductor device having the polysilicon resistor.

2. Discussion of the Related Art

Metal-oxide-semiconductor (MOS) transistors using polysilicon gate electrodes are known. Polysilicon material is able to tolerate high temperature processing better than most metals, so that polysilicon can be annealed at high temperatures along with source and drain regions. In addition, polysilicon blocks ion implantation of doped atoms into a channel region, facilitating the formation of self-aligned source and drain structures after gate patterning is completed.

The high resistivities of polysilicon materials, as compared to most metal materials result in polysilicon gate electrodes that operate at much slower speeds than gates made of metallic materials. One way of compensating for the higher resistance of polysilicon materials is to perform extensive silicide processing on the polysilicon materials so that the speed of operation of the polysilicon materials is increased to acceptable levels.

Another way of compensating for the higher resistance polysilicon materials is to replace a polysilicon gate device with a metal gate device. This replacement can be done with a replacement metal gate (RMG) process, wherein the higher temperature processing is performed while the polysilicon is present in the substrate, and after such processing, the polysilicon is removed and replaced with metal to form the replacement metal gate. More specifically, a device with a disposable polysilicon gate is processed, and the disposable gate and dielectrics are etched away, exposing an original gate oxide. The disposable polysilicon gate is then replaced by a metal gate having lower resistivity than the polysilicon material.

In known RMG processes, polysilicon is also removed from the areas forming resistors on the substrate, and replaced with metallic materials. As a result, the high resistive properties of polysilicon are not utilized for resistors on a substrate in which RMG processing has been performed.

Accordingly, there exists a need for a process in which polysilicon remains in the portions of a substrate forming the resistors so that polysilicon resistors can be formed even though an RMG process has been performed on the substrate.

SUMMARY

A method for manufacturing a semiconductor device, according to an embodiment of the inventive concept, comprises forming a first gate stack portion on a substrate, the first gate stack portion including a first gate oxide layer and a first polysilicon layer on the first gate oxide layer, forming a second gate stack portion on the substrate, the second gate stack portion including a second gate oxide layer and a second polysilicon layer on the second gate oxide layer, forming a resistor portion on the substrate, the resistor portion including a third gate oxide layer and a third polysilicon layer on the third gate oxide layer, covering the resistor portion with a photoresist, removing respective first portions of the first and second polysilicon layers from the first and second gate stack portion, removing the photoresist from the resistor portion, and after removing the photoresist from the resistor portion, removing respective remaining portions of the first and second polysilicon layers from the first and second gate stack portions.

Removing the respective first portions of the first and second polysilicon layers may comprise etching using at least one of ammonia, tetramethyl ammonium hydroxide (TMAH), and tetraethylammonium hydroxide (TEAH).

Removing the respective remaining portions of the first and second polysilicon layers from the first and second gate stack portions may comprise performing an ashing process. A portion of the third polysilicon layer may be removed from the resistor portion during the ashing process.

The method may further comprise depositing a high-K dielectric material on exposed portions of the substrate, including the first and second gate oxide layers and the third polysilicon layer, and depositing a first metal on the high-K dielectric layer. The first metal may comprise a three-layer structure of a bottom layer of TiN, a middle layer of TaN and a top layer of TiN. The method may further comprise forming a second photoresist covering the second gate stack portion and the resistor portion, removing the top layer of TiN from the first gate stack portion, removing the second photoresist, and depositing a second metal on exposed portions of the substrate, including the first and second gate stack portions and the resistor portion. The second metal may comprise a three-layer structure of a bottom layer of TiAl, a middle layer of TiN, and a top layer of titanium and aluminum alloy (Ti/Al). The method may then further comprise performing a chemical mechanical polishing to remove the high-K dielectric material, the first metal and the second metal from a top surface of the substrate, and to planarize the top surface of the substrate.

The method may further comprise depositing a first dielectric layer on the substrate adjacent and between the first and second gate stack portions and the resistor portion, depositing a high-K dielectric material on exposed portions of the substrate, including the first dielectric layer, the first and second gate oxide layers and the third polysilicon layer, depositing a metal on the high-K dielectric layer, and performing a chemical mechanical polishing to remove the high-K dielectric material, and the metal from a top surface of the substrate, and to planarize the top surface of the substrate.

The method may further comprise depositing a second dielectric layer on the planarized top surface of the substrate, performing an open mask process to remove the first and second dielectric layers from areas between the first and second gate stack portions and the resistor portion, and over the third polysilicon layer, and forming a silicide layer on portions of the substrate between the first and second gate stack portions and the resistor portion, and on the third polysilicon layer.

A semiconductor device, according to an embodiment of the inventive concept, comprises a substrate, a first gate stack portion on the substrate, the first gate stack portion including a first gate oxide layer and a first metal layer on the first gate oxide layer, a second gate stack portion on the substrate, the second gate stack portion including a second gate oxide layer and a second metal layer on the second gate oxide layer, and a resistor portion on the substrate, the resistor portion including a third gate oxide layer and a polysilicon layer on the third gate oxide layer.

The semiconductor device may further comprise a high-K dielectric layer disposed between the first gate oxide layer and the first metal layer, and between the second gate oxide layer and the second metal layer.

The first metal layer may comprise a five-layer structure of a bottom layer of TiN, a first middle layer of TaN, a second middle layer of TiAl, a third middle layer of TiN, and a top layer of titanium and aluminum alloy (Ti/Al). The second metal layer may comprise a six-layer structure of a bottom layer of TiN, a first middle layer of TaN, a second middle layer of TiN, a third middle layer of TiAl, a fourth middle layer of TiN, and a top layer of titanium and aluminum alloy (Ti/Al).

The semiconductor device may further comprise a silicide layer formed on portions of the substrate between the first and second gate stack portions and the resistor portion, and on the polysilicon layer, and a dielectric layer on the substrate adjacent and between the first and second gate stack portions and the resistor portion.

A computer system, according to an embodiment of the inventive concept, comprises the semiconductor device, wherein the computer system is one of a personal computer (PC), a personal digital assistant (PDA), an MP3 player, a digital audio recorder, a pen-shaped computer, a digital camera, or a video recorder.

A method for manufacturing a semiconductor device, according to an embodiment of the inventive concept, comprises forming a gate stack portion on a substrate, the gate stack portion including a first gate oxide layer and a first polysilicon layer on the first gate oxide layer, forming a resistor portion on the substrate, the resistor portion including a second gate oxide layer and a second polysilicon layer on the second gate oxide layer, covering the resistor portion with a photoresist, removing a first portion of the first polysilicon layer from the gate stack portion, removing the photoresist from the resistor portion, and after removing the photoresist from the resistor portion, removing a remaining portion of the first polysilicon layer from the gate stack portion.

Removing the first portion of the first polysilicon layer may comprise etching using at least one of ammonia, tetramethyl ammonium hydroxide (TMAH), and tetraethylammonium hydroxide (TEAH).

Removing the remaining portion of the first polysilicon layer from the gate stack portion may comprise performing an ashing process. A portion of the second polysilicon layer may be removed from the resistor portion during the ashing process.

The method may further comprise depositing a first dielectric layer on the substrate adjacent and between the gate stack portion and the resistor portion, depositing a high-K dielectric material on exposed portions of the substrate, including the first dielectric layer, the first gate oxide layer and the second polysilicon layer, depositing a metal on the high-K dielectric layer, and performing a chemical mechanical polishing to remove the high-K dielectric material, and the metal from a top surface of the substrate, and to planarize the top surface of the substrate.

The method may further comprise depositing a second dielectric layer on the planarized top surface of the substrate, performing an open mask process to remove the first and second dielectric layers from areas between the gate stack portion and the resistor portion, and over the second polysilicon layer, and forming a silicide layer on portions of the substrate between the gate stack portion and the resistor portion, and on the second polysilicon layer.

A system for transmitting or receiving data, according to an embodiment of the inventive concept, comprises a memory device for storing a program, and a processor in communication with the memory device, wherein the memory device comprises a substrate, a first gate stack portion on the substrate, the first gate stack portion including a first gate oxide layer and a first metal layer on the first gate oxide layer, a second gate stack portion on the substrate, the second gate stack portion including a second gate oxide layer and a second metal layer on the second gate oxide layer, and a resistor portion on the substrate, the resistor portion including a third gate oxide layer and a polysilicon layer on the third gate oxide layer. The system may comprise at least one of a mobile system, a portable computer, a web tablet, a mobile phone, a digital music player, or a memory card.

A semiconductor memory card, according to an embodiment of the present inventive concept, comprises an interface part that interfaces with an external device, a controller that communicates with the interface part and a memory device via address and data buses, wherein the memory device comprises a substrate, a first gate stack portion on the substrate, the first gate stack portion including a first gate oxide layer and a first metal layer on the first gate oxide layer, a second gate stack portion on the substrate, the second gate stack portion including a second gate oxide layer and a second metal layer on the second gate oxide layer, and a resistor portion on the substrate, the resistor portion including a third gate oxide layer and a polysilicon layer on the third gate oxide layer.

A computer system, according to an embodiment of the inventive concept, comprises a semiconductor device having a circuit layout manufactured by any of the above methods, wherein the computer system is one of a personal computer (PC), a personal digital assistant (PDA), an MP3 player, a digital audio recorder, a pen-shaped computer, a digital camera, or a video recorder.

A system for transmitting or receiving data, according to an embodiment of the inventive concept, comprises a memory device for storing a program, and a processor in communication with the memory device, wherein the memory device comprises a circuit layout manufactured by any of the above methods. The system may comprise at least one of a mobile system, a portable computer, a web tablet, a mobile phone, a digital music player, or a memory card.

A semiconductor memory card, according to an embodiment of the present inventive concept, comprises an interface part that interfaces with an external device, a controller that communicates with the interface part and a memory device via address and data buses, wherein the memory device comprises a circuit layout manufactured by any of the above methods.

BRIEF DESCRIPTION OF THE DRAWINGS

Exemplary embodiments of the present inventive concept will be described below in more detail, with reference to the accompanying drawings, of which.

DETAILED DESCRIPTION OF THE EMBODIMENTS

Exemplary embodiments of the present inventive concept now will be described more fully hereinafter with reference to the accompanying drawings. This inventive concept may, however, be embodied in many different forms and should not be construed as limited to the embodiments set forth herein.

Figure 1:
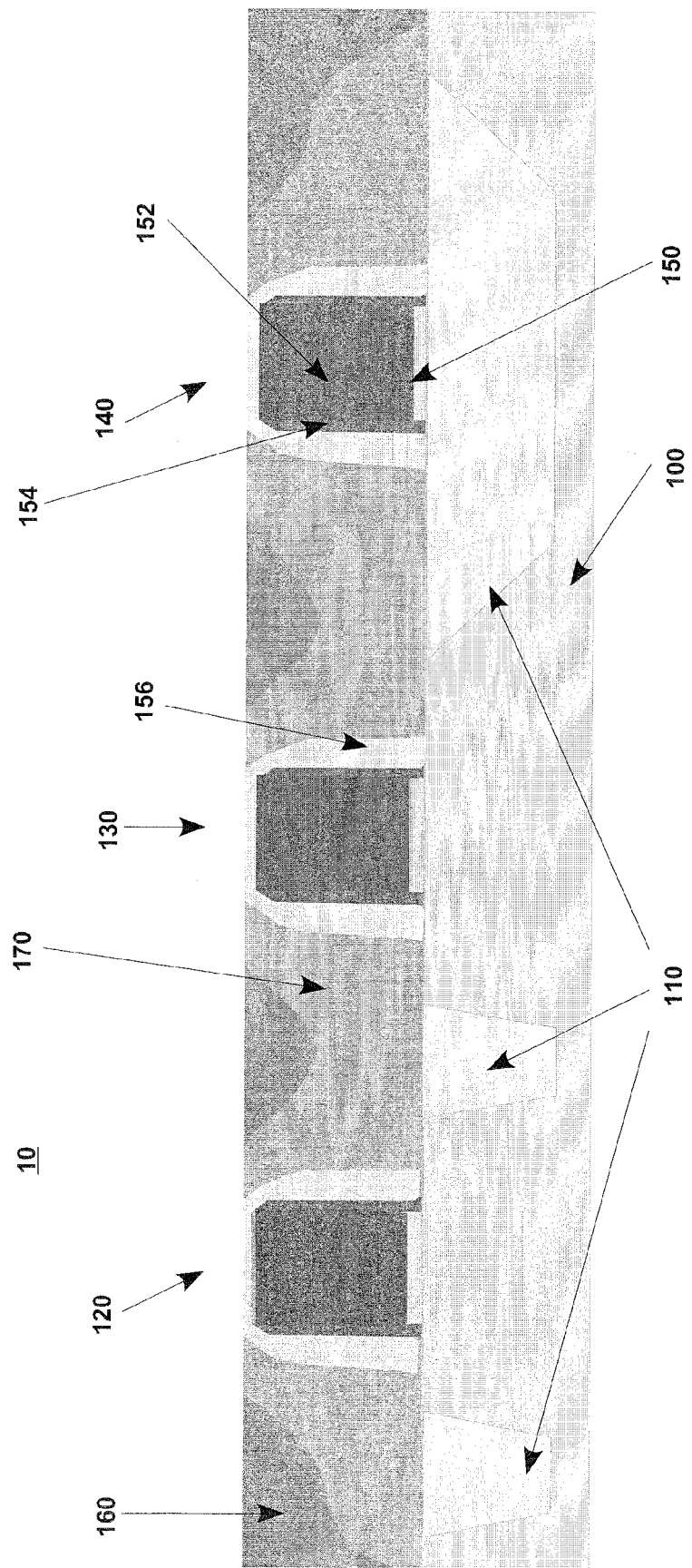
FIGS. 1-13 are cross-sectional views of a semiconductor substrate for illustrating a replacement metal gate process, and a resulting semiconductor device, according to embodiments of the present inventive concept.

Referring to FIG. 1, according to an embodiment of the present inventive concept, a semiconductor device 10 includes a substrate 100 including a plurality of shallow trench isolation (STI) regions 110. On the substrate 100 are formed a first single gate (SG) field-effect transistor (FET) 120, a second SG FET 130, and a resistor structure 140. According to an embodiment of the present inventive concept, the first SG FET 120 is an NFET, the second SG FET 130 is a PFET, and the resistor structure 140 includes a P+ poly resistor. Alternatively, the doping can be reversed, and the first SG FET 120 can be a PFET, the second SG FET 130 can be an NFET, and the resistor can be an N+ poly resistor. As can be seen, the area of the STI region 110 under the resistor structure 140 is larger than those of the remaining STI regions 110 between and adjacent the FETs.

A combination of a stress liner 160, including, for example, silicon nitride (SiN), and a dielectric 170, such as undoped silicate glass (USG) or silicon dioxide ($SiO_2$) are deposited on the substrate, and fill in the areas between and adjacent the FETs 120, 130 and the resistor structure 140. The resulting structure shown in FIG. 1 is formed after chemical mechanical polishing (CMP), which planarizes the top surface.

As can be seen in FIG. 1, the FETs 120, 130 and the resistor structure 140 each include a gate oxide layer 150, polysilicon 152 formed on the gate oxide layer 150, and sidewall spacers 154, 156 formed on the sides of the polysilicon 152. The number and thickness of the sidewall spacers 154, 156 can vary depending on design constraints, and is not limited to what is shown in FIG. 1. For example, the number of sidewall spacers can be more or less than 2, and the thickness of the sidewall spacer(s) can vary. According to an embodiment, SiN can be used as a material for at least one pair of sidewall spacers.

Figure 2:
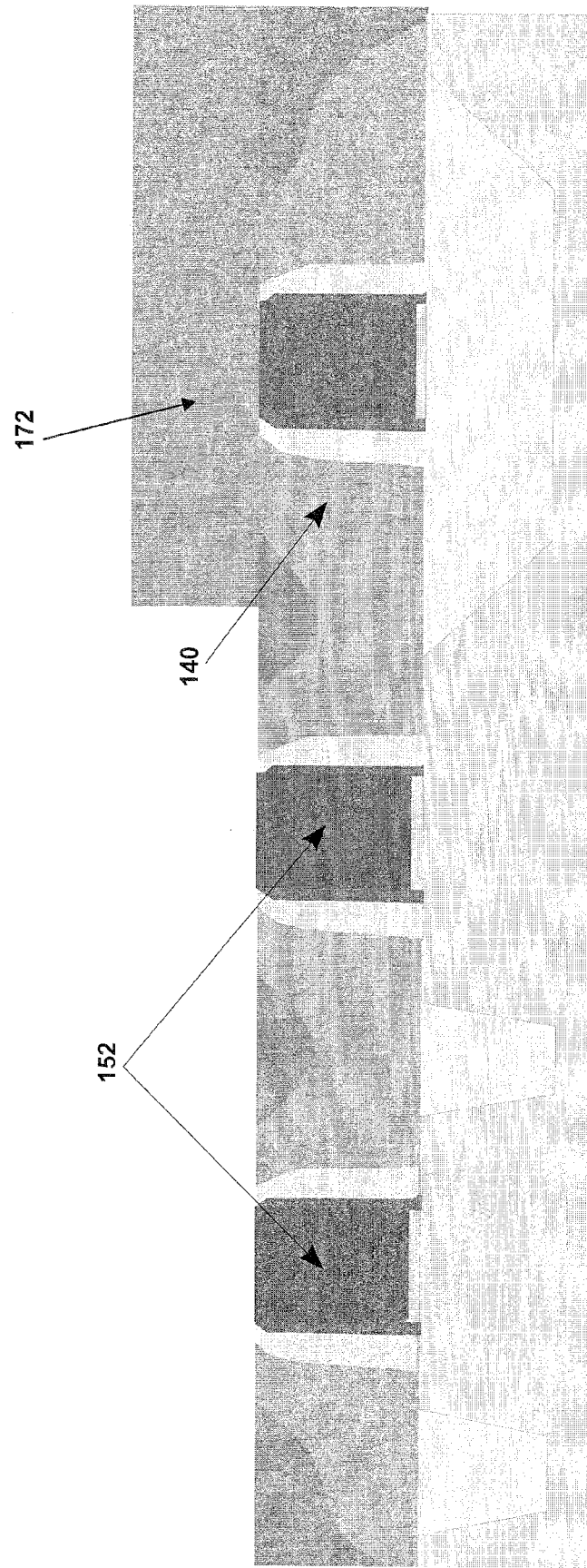

Referring to FIG. 2, prior to a process for removing the polysilicon 152, a photoresist 172 is formed over an area of the substrate 100 including the resistor structure 140 so as to prevent removal of the polysilicon 152 from the area that will form the resistor. After placement of the photoresist 172, an etching process is performed to remove the polysilicon 152 from the FETs 120 and 130. The etch process may be, for example, a wet etch process using, for example, ammonia, tetramethyl ammonium hydroxide (TMAH), and/or tetraethylammonium hydroxide (TEAH).

Figure 3:
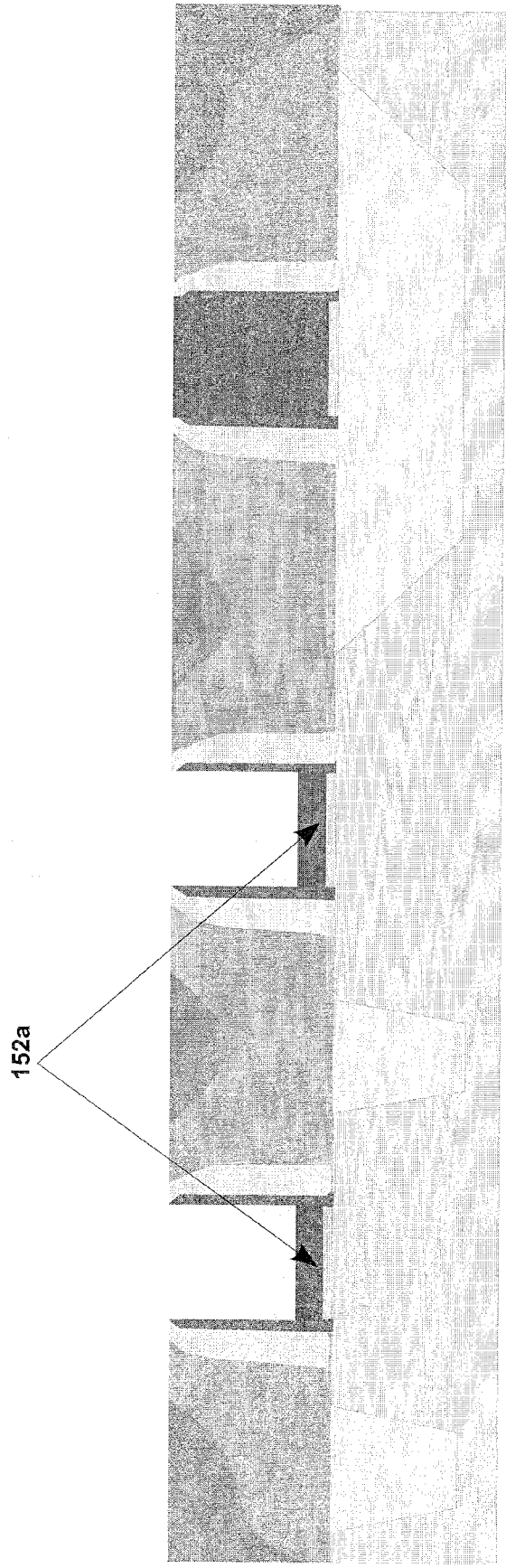
Figure 4:
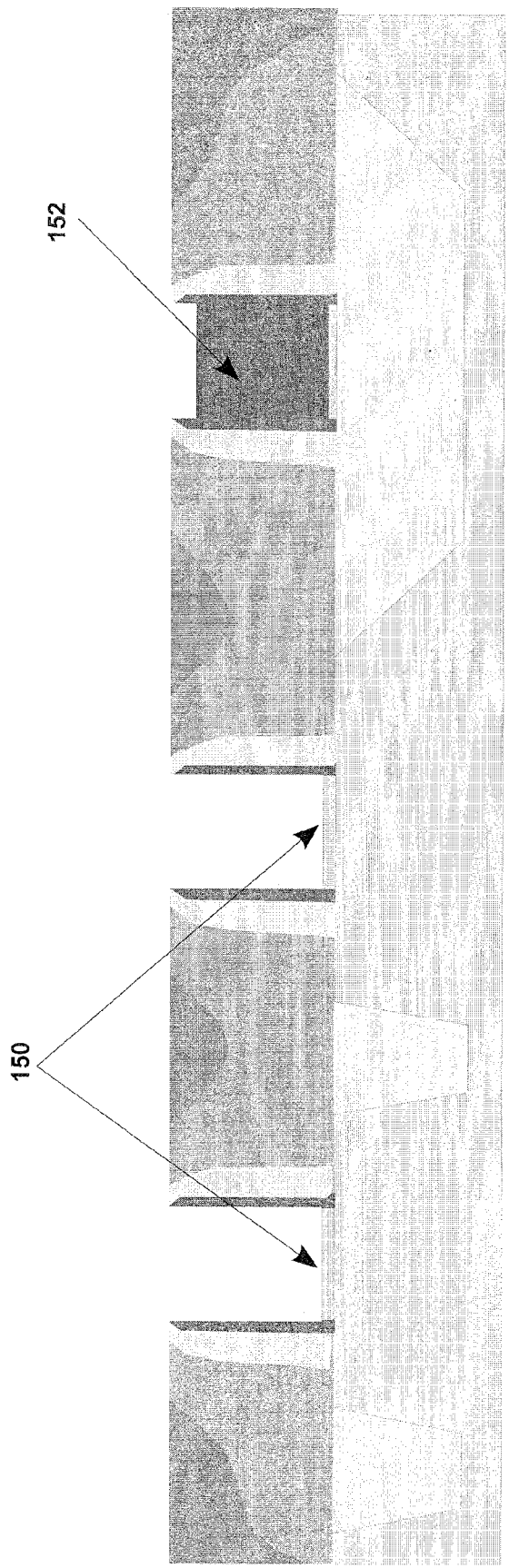

Referring to FIG. 3, an upper portion of the polysilicon material 152 is removed from the FETs 120, 130 using, for example, a light stream wet etch process. A lower portion 152a of the polysilicon remains after the upper portion is removed. The photoresist 172 is removed after the etch. Referring to FIG. 4, an ashing process, using, for example, $H_2N_2$, is used to remove the remaining portion 152a of the polysilicon. In addition, some of the polysilicon 152 in the resistor structure 140 is removed during the ashing process. A two-step polysilicon removal process allows the time for the light stream wet etch process to be reduced so as to prevent the height of the FETs 120, 130 from being overly reduced during the light stream wet etch process. Further, a two-step polysilicon removal process prevents residue from the photoresist 172 from forming in the area where the poly resistor is formed.

Figure 5:
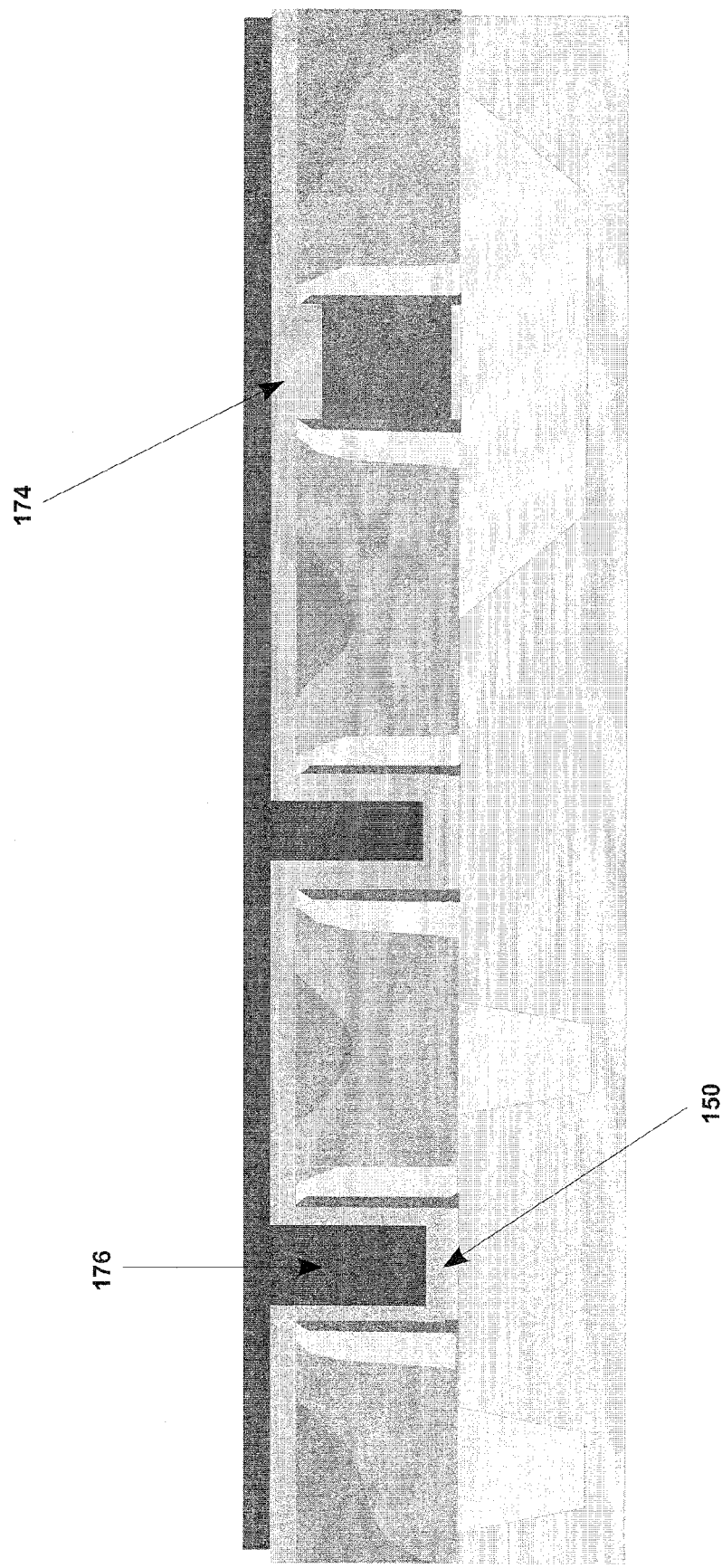

Referring to FIG. 5, a high-K dielectric material 174 having a high dielectric constant κ when compared with that of silicon dioxide such as, for example, hafnium silicate, zirconium silicate, hafnium dioxide and/or zirconium dioxide, is deposited on the structure shown in FIG. 4 using, for example, chemical vapor deposition, atomic layer deposition or molecular layer deposition. After deposition of the high-K dielectric 174, a first metal 176, comprising, for example, a three-layer structure of a bottom layer of TiN, a middle layer of TaN and a top layer of TiN, is deposited on the high-K layer 174. The first metal 176 is not limited to this structure, and may include different materials in different layer configurations.

Figure 6:
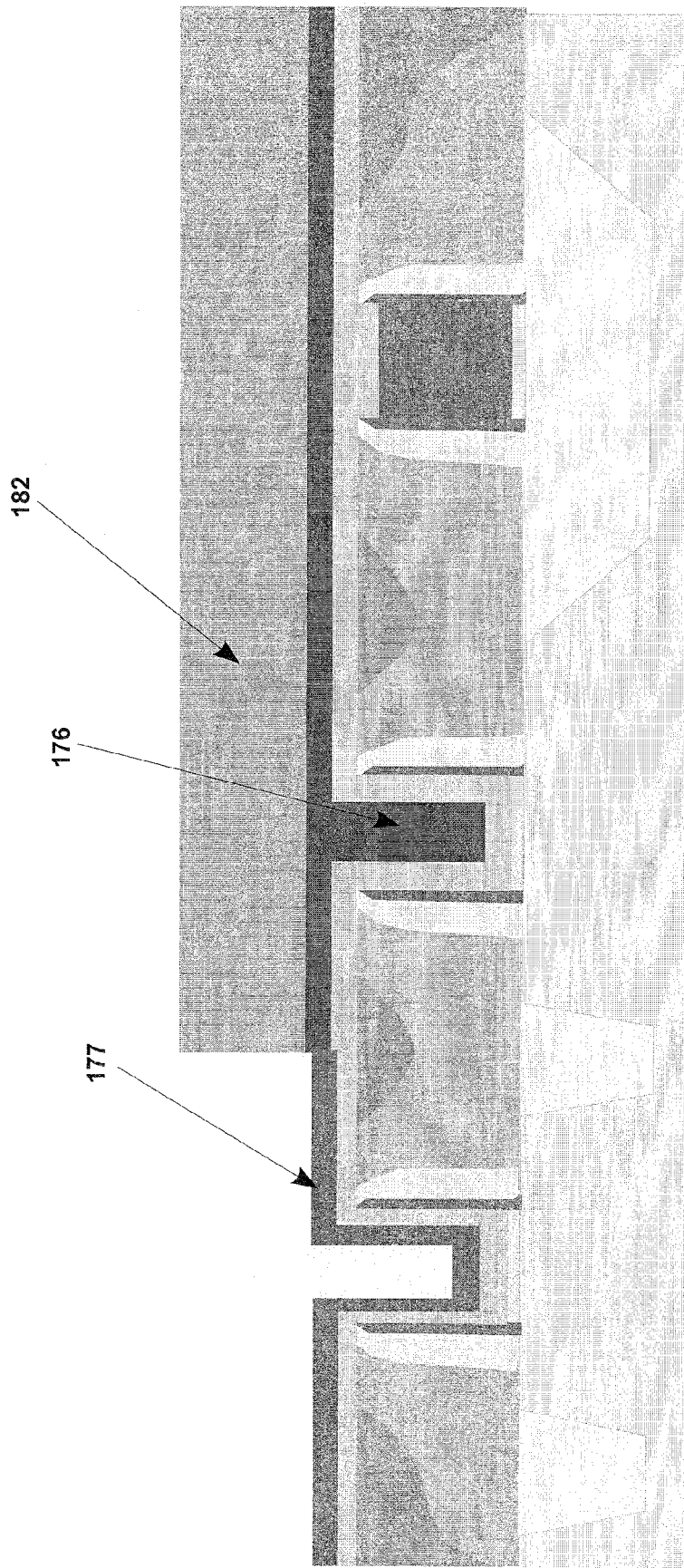

Referring to FIG. 6, in connection with an embodiment where the first metal 176 includes the above-referenced three-layer structure, the top TiN layer is removed from the SG NFET 120, and areas adjacent thereto to result in a two-layer structure 177 including a bottom layer of TiN and a top layer of TaN. A photoresist 182 made of, for example, an oxide or nitride, is used to cover the SG PFET 130, the resistor structure 140, and areas adjacent thereto so that the top TiN layer is not removed from the covered areas. Thereafter, referring to FIG. 7, after the photoresist 182 is removed, a second metal 178 including, for example, a three-layer structure of a bottom layer of TiAl, a middle layer of TiN, and a top layer of titanium and aluminum alloy (Ti/Al), is deposited on the remaining structure. As a result, according to an embodiment, the metal gate 121 (see FIG. 8) for the SG NFET 120 includes a 5-layer structure (from bottom to top) of TiN—TaN—TiAl—TiN—Ti/Al, and the metal gate 131 (see FIG. 8) for the SG PFET 130 includes a 6-layer structure (from bottom to top) of: TiN—TaN—TiN—TiAl—TiN—Ti/Al. According to alternative embodiments, the metal gates may include different materials in different layer configurations.

Figure 7:
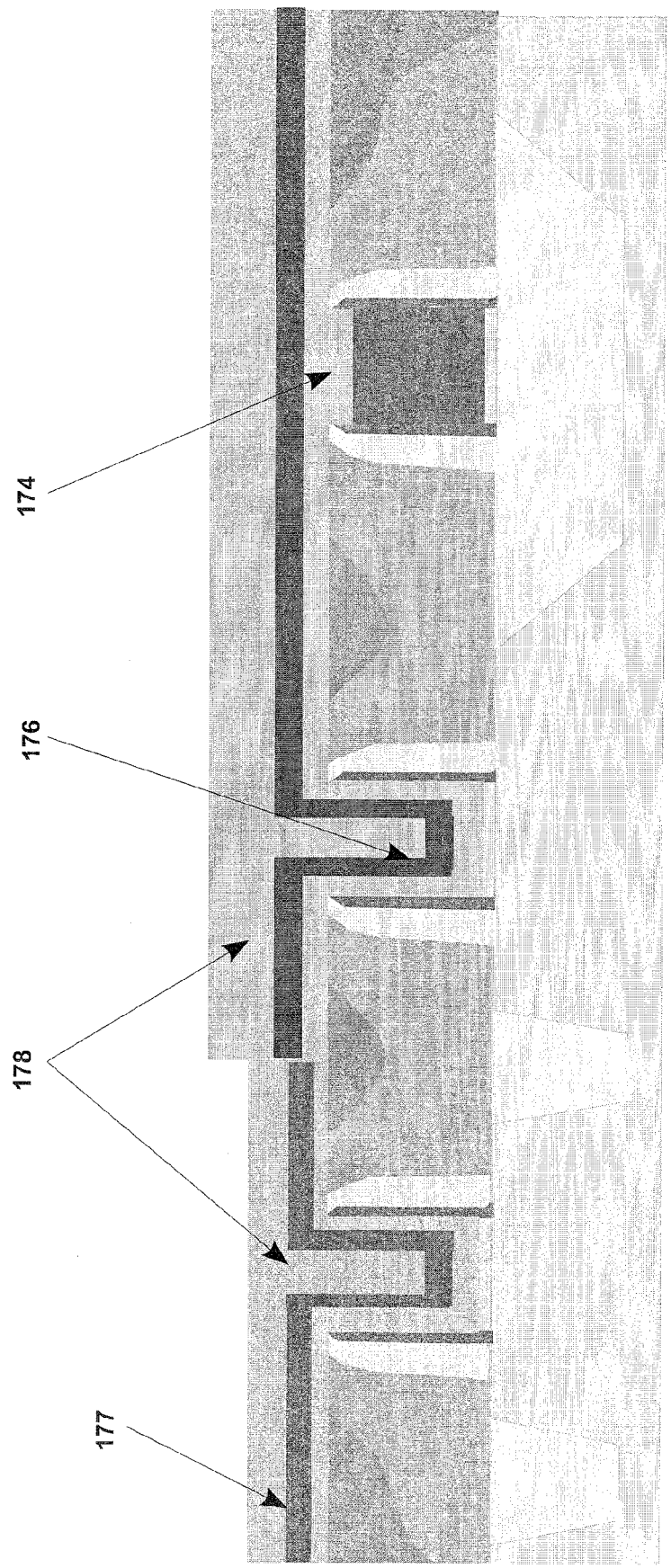
Figure 8:
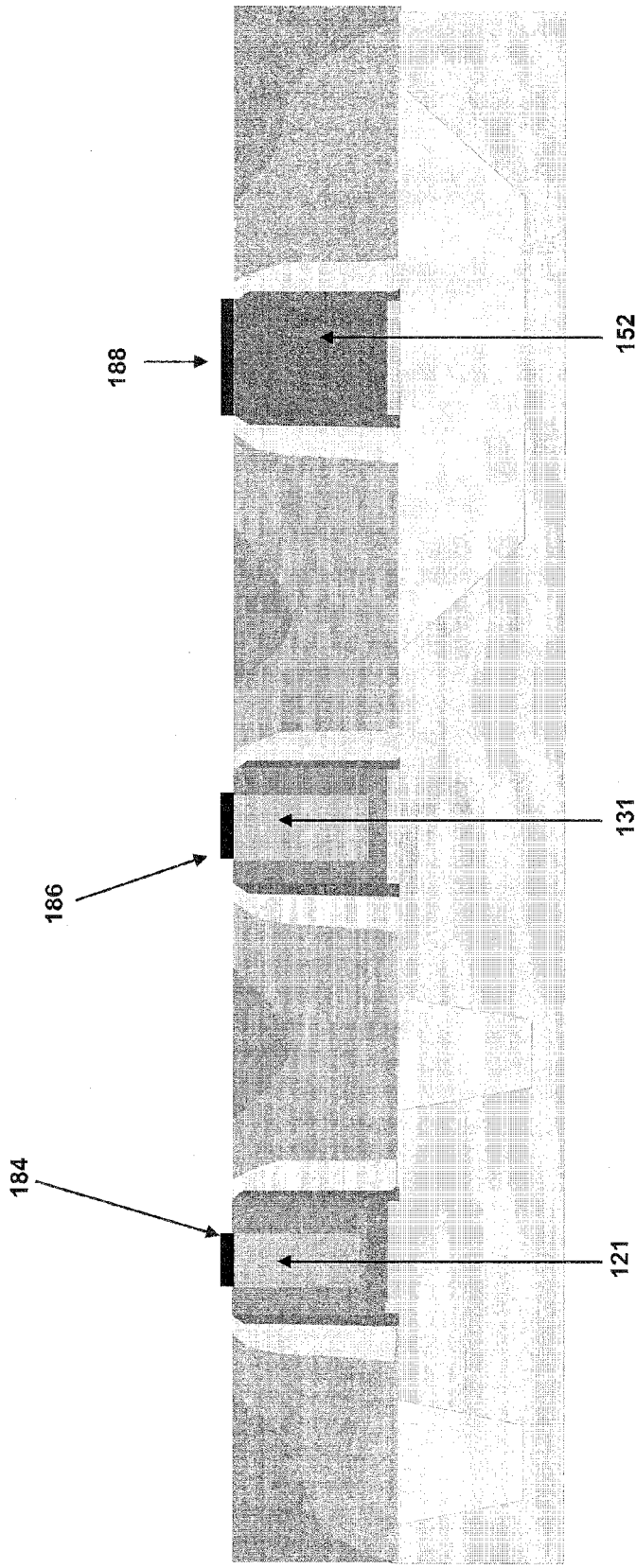

Referring now to FIG. 8, aluminum chemical mechanical polishing (Al CMP) is performed on the structure in FIG. 7. The Al CMP process is performed with a slurry to remove the high-K, and first and second metal layers 174, 176, 178 from a top surface of the substrate, and to planarize the top surface. As a result of the Al CMP process, the structure shown in FIG. 8 is formed, wherein the height of the FETs 120 and 130, and the resistor structure 140 is reduced. As can be seen, the height of the resistor structure 140 is reduced down to the polysilicon material 152. Oxidation during the CMP process results in metal oxides 184 and 186 being formed on top of the metal gates 121, 131 of each of the FETs 120 and 130, and a silicon oxide 188 formed on top of the polysilicon material 152, which forms the resistor of the resistor structure 140. According to an embodiment, a thickness of the metal oxides 184, 186 and the silicon oxide 188 is about 20 Å to about 30 Å.

Figure 9:
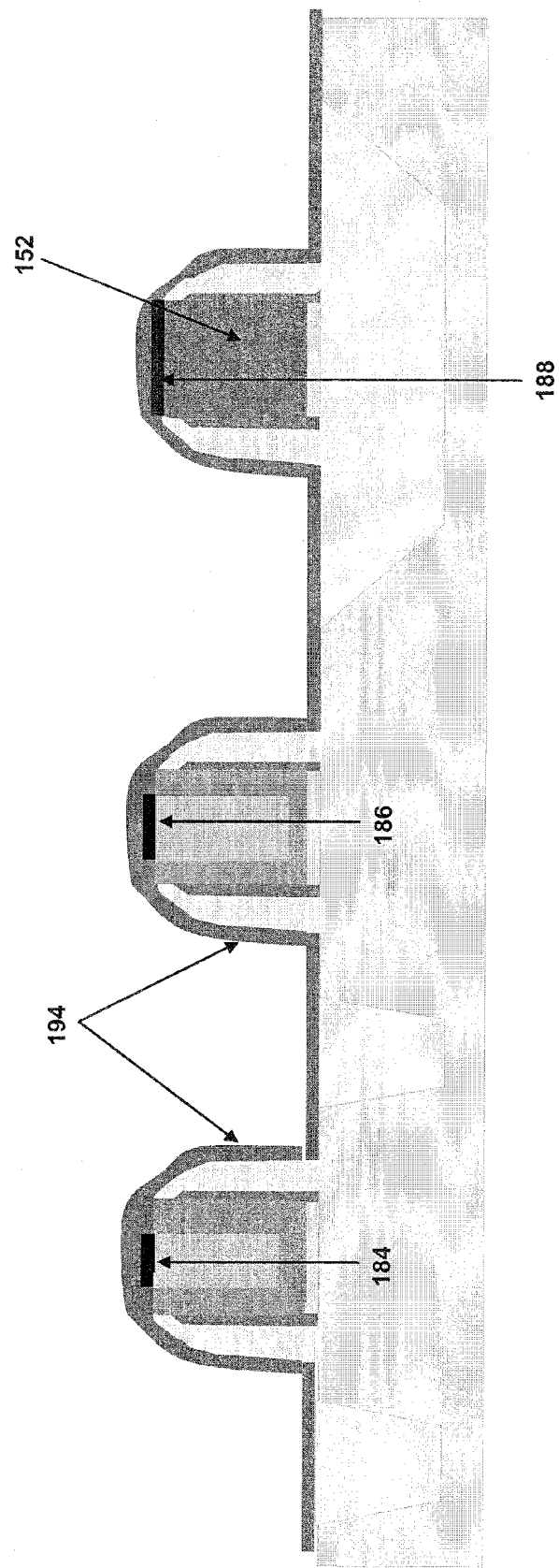

Referring to FIG. 9, the stress liner 160 and dielectric 170 are removed from the substrate 100 by an etching process, such as, for example, a wet etch process. Then a second high-K dielectric layer 194 is deposited on the substrate 100 including the FETs 120, 130 and the resistor structure 140 to protect the resistor and the gates. The second high-K dielectric layer 194 may include, for example, hafnium silicate, zirconium silicate, hafnium dioxide and/or zirconium dioxide, and is deposited using, for example, chemical vapor deposition, atomic layer deposition or molecular layer deposition. Then, referring to FIG. 10, a layer of silicon nitride (SiN) or silicon dioxide ($SiO_2$) 196 is deposited on the structure shown in FIG. 9 to result in the structure shown in FIG. 10. The layer 196 is deposited using, for example, chemical vapor deposition, atomic layer deposition or molecular layer deposition.

Figure 11:
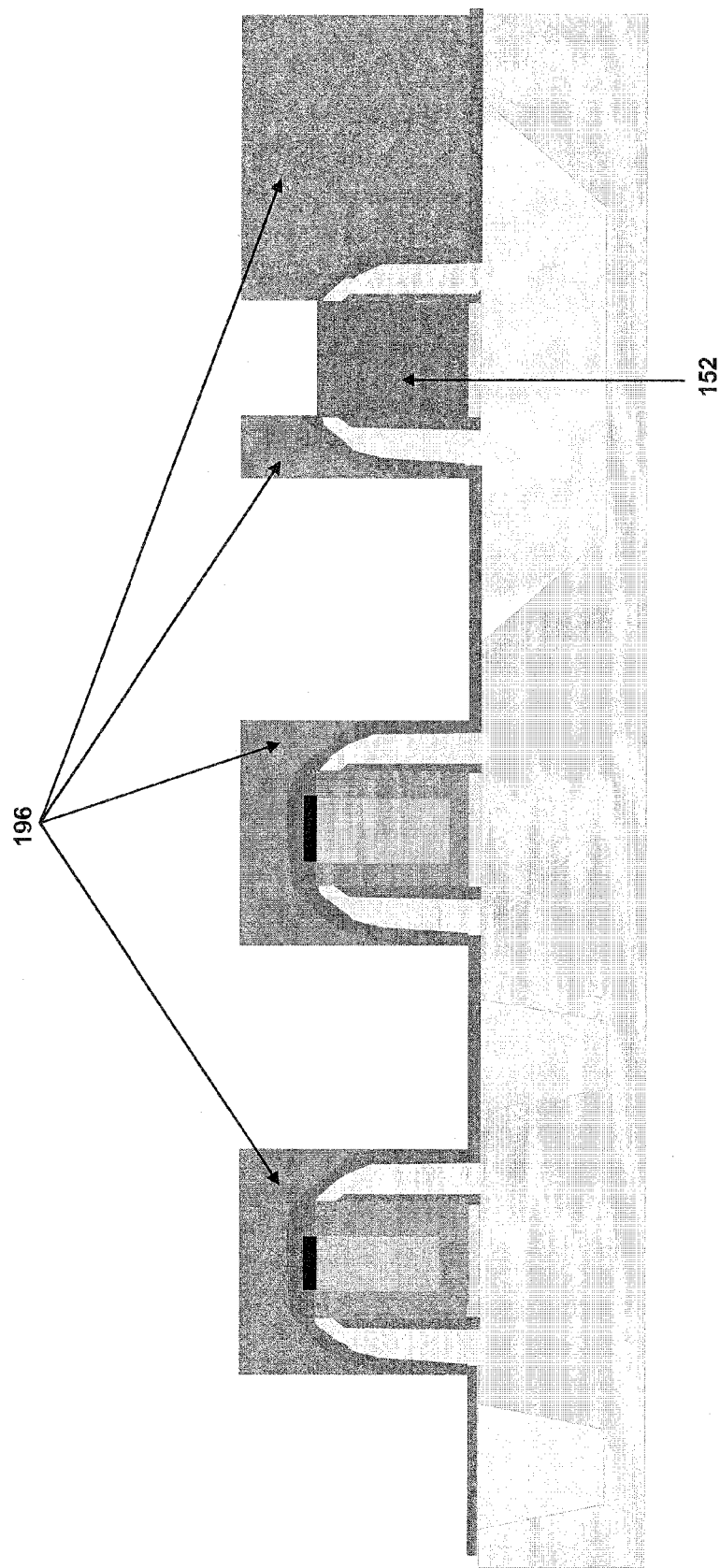

Referring to FIG. 11, using an open mask process, the layer 196 is removed from the areas between the gate and resistor stacks, and over the polysilicon 152 forming the resistor, as shown. The areas where the layer 196 is not removed are masked during the removal process. The removal of the layer 196 may be performed using, for example, a light or chemical etching process.

Figure 10:
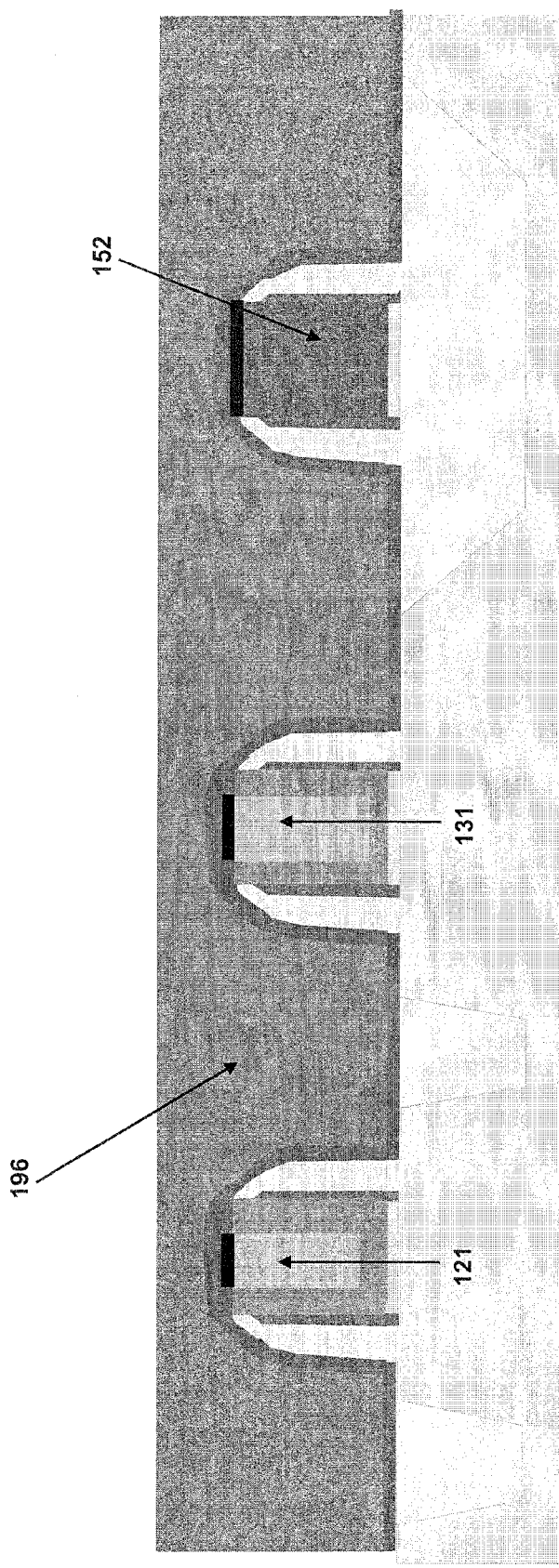

According to an alternative embodiment, instead of depositing the second high-K dielectric layer 194 on the substrate 100, and depositing the layer 196 as shown in FIGS. 9 and 10, a layer of silicon nitride (SiN) or silicon dioxide ($SiO_2$) is deposited on the structure shown in FIG. 8 to result in a structure that is similar to that shown in FIG. 10, but does not include the second high-K dielectric layer 194. Then, using an open mask process, the SiN or $SiO_2$ layer is removed from the areas between the gate and resistor stacks, and over the polysilicon 152 forming the resistor, to result in a structure similar to that shown in FIG. 11, without the second high-K dielectric layer 194.

Figure 12:
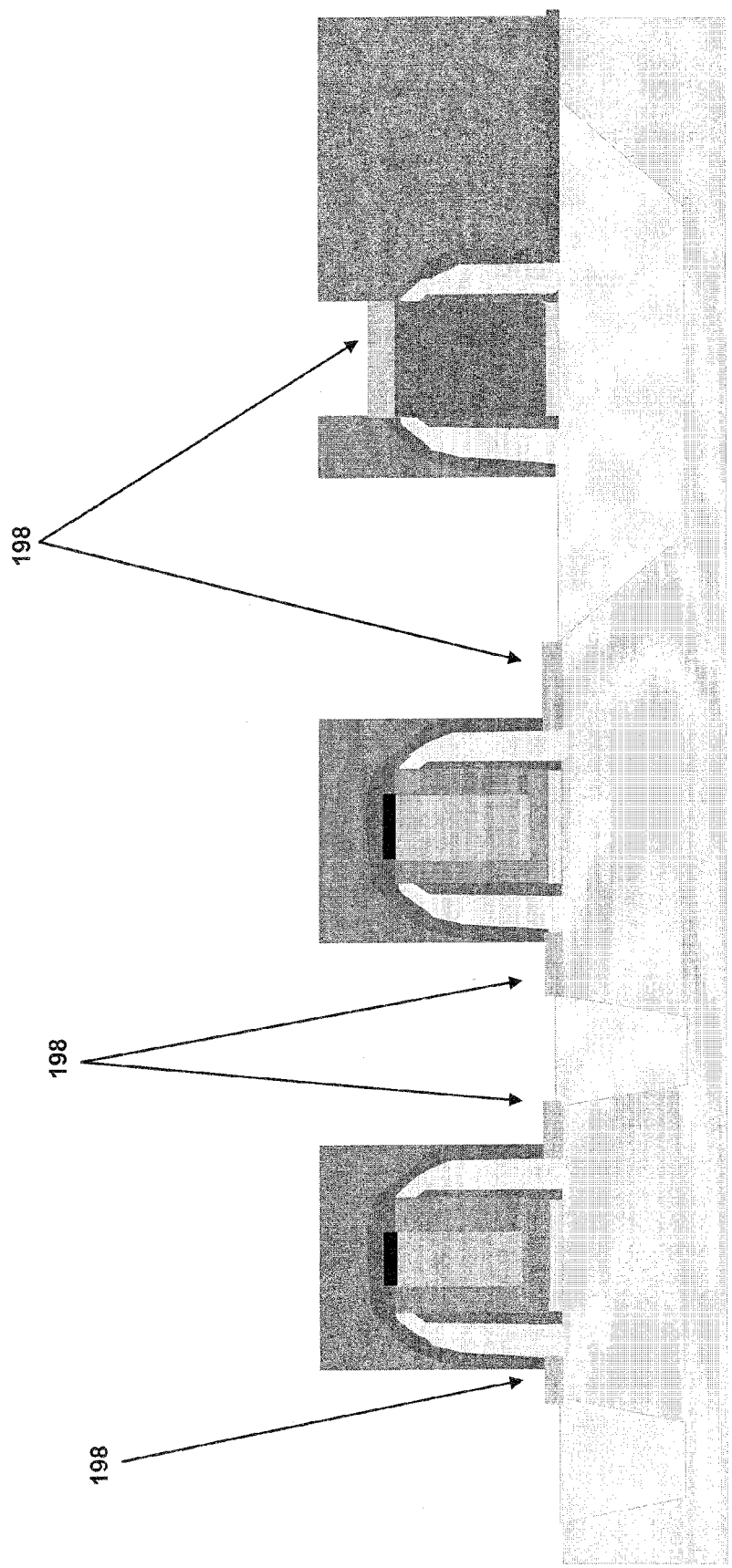

Referring to FIG. 12, silicide is formed on the structure shown in FIG. 11, or on the similar structure formed in the alternative embodiment described above. The silicide can be, for example, nickel silicide (NiSi), but is not limited thereto. Other silicides, such as, for example, sodium silicide ($Na_2Si$), magnesium silicide ($Mg_2Si$), platinum silicide (PtSi), titantium silicide ($TiSi_2$), and tungsten silicide ($WSi_2$), can be used. For purposes of explanation, NiSi is described in connection with the instant embodiment. According to an embodiment, prior to depositing nickel (Ni) on the substrate, the substrate is pre-cleaned to remove oxides, such as the oxides forming the second high-K dielectric layer 194, from those portions of the substrate where the silicide is to be formed, for example, between the gate and resistor stacks. After pre-cleaning, Ni is deposited to react with the silicon in the designated areas, and form the silicide 198. After Ni deposition, annealing is performed, then unreacted Ni is removed, and annealing is again performed. The silicide 198 reduces sheet resistance.

Figure 13:
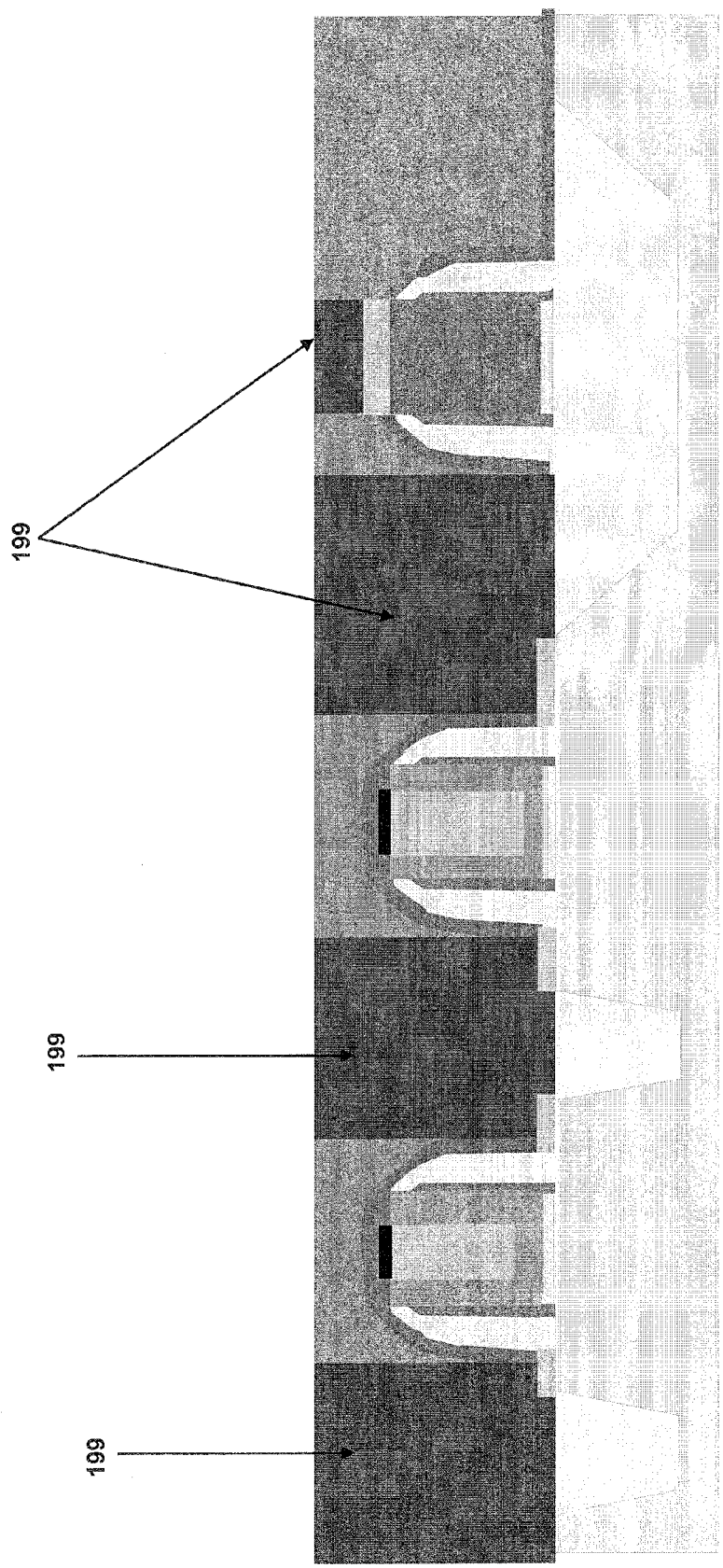

According to an embodiment, referring to FIG. 13, after silicide formation, a layer of silicon nitride (SiN) or silicon dioxide ($SiO_2$) 199 can be deposited on the structure shown in FIG. 12, and thereafter CMP can be performed to result in the structure shown in FIG. 13. The SiN or $SiO_2$ can be deposited using, for example, chemical vapor deposition, atomic layer deposition or molecular layer deposition.

Figure 14:
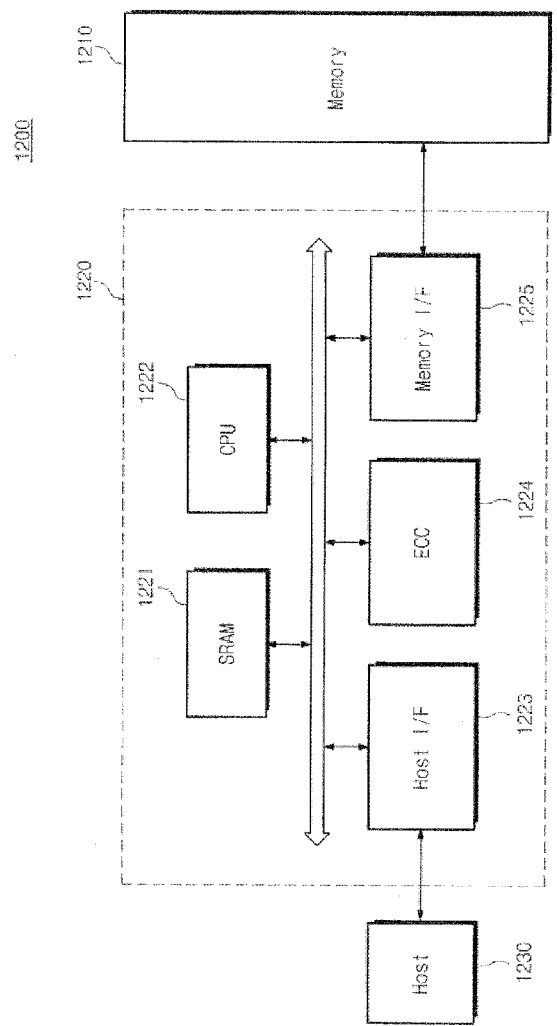
FIG. 14 is a block diagram of a memory card having a semiconductor device according to an embodiment of the present inventive concept.

FIG. 14 is a block diagram of a memory card having a semiconductor device according to an embodiment of the inventive concept.

Referring to FIG. 14, a semiconductor memory 1210 including semiconductor devices according to various embodiments of the inventive concept may be applicable to a memory card 1200. For example, the memory card 1200 includes a memory controller 1220 that controls data exchange between a host and the memory 1210. An SRAM 1221 may be used as a working memory of a central processing unit (CPU) 1222. A host interface (I/F) 1223 may have a data exchange protocol of the host connected to the memory card 1200. An error correction code (ECC) 1224 detects and corrects an error in data read from the memory 1210. A memory interface (I/F) 1225 interfaces with the memory 1210. The CPU 1222 performs an overall control operation for data exchange of the memory controller 1220.

Figure 15:
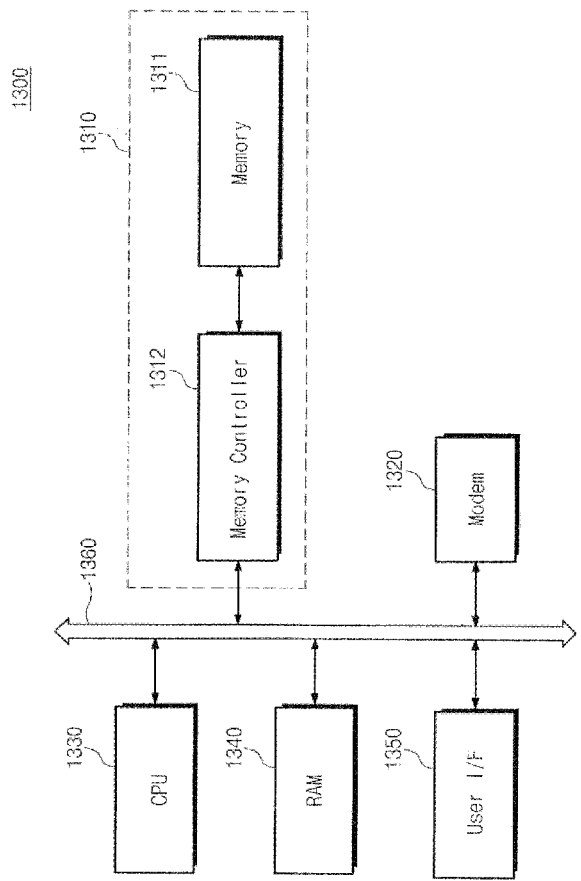
FIG. 15 is a block diagram of an information processing system using a semiconductor device according to an embodiment of the present inventive concept.

FIG. 15 is a block diagram of an information processing system using a semiconductor device according to an embodiment of the inventive concept.

Referring to FIG. 15, an information processing system 1300 may include a memory system 1310 having a semiconductor device according to an embodiment of the inventive concept. Examples of the information processing system 1300 include mobile devices and computers. For example, the information processing system 1300 includes a memory system 1310, a modem 1320, a central processing unit (CPU) 1330, a RAM 1340, and a user interface 1350 that are electrically connected to a system bus 1360. The memory system 1310 may include a memory 1311 and a memory controller 1312 and may have substantially the same configuration as the memory card 1200 of FIG. 14. Data processed by the CPU 1330 or data received from an external device may be stored in the memory system 1310. The information processing system 1300 may be provided for memory cards, solid state disks, camera image sensors, and other application chipsets. For example, the memory system 1310 may be configured using a solid state disk (SSD). In this case, the information processing system 1300 can store a large amount of data in the memory system 1310 stably and reliably.

Figure 16:
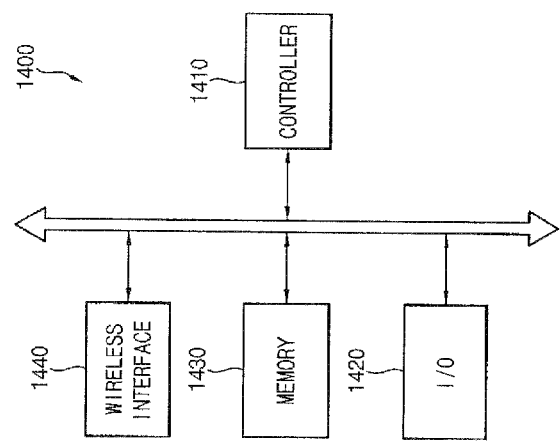
FIG. 16 is a block diagram of an electronic device including a semiconductor device according to exemplary embodiments of the present inventive concept.

Referring to FIG. 16, an electronic device including a semiconductor device according to exemplary embodiments of the present inventive concept will be described. The electronic device 1400 may be used in a wireless communication device (e.g., a personal digital assistant, a laptop computer, a portable computer, a web tablet, a wireless telephone, a mobile phone and/or a wireless digital music player) or in any device capable of transmitting and/or receiving information via wireless environments.

The electronic device 1400 includes a controller 1410, an input/output (I/O) device 1420 (e.g., a keypad, a keyboard, and a display), a memory 1430 having a semiconductor device according to at least one embodiment of the present inventive concept, and a wireless interface 1440. The controller 1410 may include at least one of a microprocessor, a digital signal processor, or a similar processing device. The memory 1430 may be used to store commands executed by the controller 1410, for example. The memory 1430 may be used to store user data. The memory 1430 includes a semiconductor device according to at least one embodiment of the present inventive concept. The electronic device 1400 may utilize the wireless interface 1440 to transmit/receive data via a wireless communication network. For example, the wireless interface 1440 may include an antenna and/or a wireless transceiver. The electronic device 1400 according to exemplary embodiments may be used in a communication interface protocol of a third generation communication system, e.g., code division multiple access (CDMA), global system for mobile communications (GSM), north American digital cellular (NADC), extended-time division multiple access (E-TDMA) and/or wide band code division multiple access (WCDMA), CDMA2000.

Although exemplary embodiments of the present inventive concept have been described hereinabove, it should be understood that the present inventive concept is not limited to these embodiments, but may be modified by those skilled in the art without departing from the spirit and scope of the present inventive concept.

What is claimed is:

1. A method for manufacturing a semiconductor device, comprising:

forming a first gate stack portion on a substrate, the first gate stack portion including a first gate oxide layer and a first polysilicon layer on the first gate oxide layer;

forming a second gate stack portion on the substrate, the second gate stack portion including a second gate oxide layer and a second polysilicon layer on the second gate oxide layer;

forming a resistor portion on the substrate, the resistor portion including a third gate oxide layer and a third polysilicon layer on the third gate oxide layer, wherein the resistor portion is disposed at a substantially same height from an upper surface of the substrate as the first and the second gate stack portion;
covering the resistor portion with a photoresist without covering the first and the second gate stack portion;
removing respective first portions of the first and second polysilicon layers from the first and second gate stack portions;
removing the photoresist from the resistor portion; and
after removing the photoresist from the resistor portion, removing respective remaining portions of the first and second polysilicon layers from the first and second gate stack portions.

2. The method for manufacturing the semiconductor device according to claim 1, wherein removing the respective first portions of the first and second polysilicon layers comprises etching using at least one of ammonia, tetramethyl ammonium hydroxide (TMAH), and tetraethylammonium hydroxide (TEAH).

3. The method for manufacturing the semiconductor device according to claim 1, wherein removing the respective remaining portions of the first and second polysilicon layers from the first and second gate stack portions comprises performing an ashing process.

4. The method for manufacturing the semiconductor device according to claim 3, wherein a portion of the third polysilicon layer is removed from the resistor portion during the ashing process.

5. The method for manufacturing the semiconductor device according to claim 4, further comprising:
depositing a high-K dielectric material on exposed portions of the substrate, including the first and second gate oxide layers and the third polysilicon layer; and
depositing a first metal on the high-K dielectric layer.

6. The method for manufacturing the semiconductor device according to claim 4, further comprising:
depositing a first dielectric layer on the substrate adjacent and between the first and second gate stack portions and the resistor portion;
depositing a high-K dielectric material on exposed portions of the substrate, including the first dielectric layer, the first and second gate oxide layers and the third polysilicon layer; and
depositing a metal on the high-K dielectric layer.

7. The method for manufacturing the semiconductor device according to claim 6, further comprising:
performing a chemical mechanical polishing to remove the high-K dielectric material, and the metal from a top surface of the semiconductor device, and to planarize the top surface of the semiconductor device.

8. The method for manufacturing the semiconductor device according to claim 7, further comprising:
depositing a second dielectric layer on the planarized top surface of the substrate;
performing an open mask process to remove the first and second dielectric layers from areas between the first and second gate stack portions and the resistor portion, and over the third polysilicon layer; and
forming a silicide layer on portions of the substrate between the first and second gate stack portions and the resistor portion, and on the third polysilicon layer.

9. The method for manufacturing the semiconductor device according to claim 5, wherein the first metal comprises a three-layer structure of a bottom layer of TiN, a middle layer of TaN and a top layer of TiN.

10. The method of manufacturing the semiconductor device according to claim 9, further comprising:
forming a second photoresist covering the second gate stack portion and the resistor portion; and
removing the top layer of TiN from the first gate stack portion.

11. The method for manufacturing the semiconductor device according to claim 10, further comprising:
removing the second photoresist; and
depositing a second metal on exposed portions of the substrate, including the first and second gate stack portions and the resistor portion.

12. The method for manufacturing the semiconductor device according to claim 11, wherein the second metal comprises a three-layer structure of a bottom layer of TiAl, a middle layer of TiN, and a top layer of titanium and aluminum alloy (Ti/Al).

13. The method for manufacturing the semiconductor device according to claim 11, further comprising:
performing a chemical mechanical polishing to remove the high-K dielectric material, the first metal and the second metal from a top surface of the semiconductor device, and to planarize the top surface of the semiconductor device.

14. A computer system comprising a semiconductor device having a circuit layout manufactured by the method of claim 1, wherein the computer system is one of a personal computer (PC), a personal digital assistant (PDA), an MP3 player, a digital audio recorder, a pen-shaped computer, a digital camera, or a video recorder.

15. A system for transmitting or receiving data, the system comprising:
a memory device for storing a program; and
a processor in communication with the memory device, wherein the memory device comprises a circuit layout manufactured by the method of claim 1.

16. The system according to claim 15, wherein the system comprises at least one of a mobile system, a portable computer, a web tablet, a mobile phone, a digital music player, or a memory card.

17. A semiconductor memory card, comprising:
an interface part that interfaces with an external device;
a controller that communicates with the interface part and a memory device via address and data buses, wherein the memory device comprises a circuit layout manufactured by the method of claim 1.

18. A method for manufacturing a semiconductor device, comprising:
forming a gate stack portion on a substrate, the gate stack portion including a first gate oxide layer and a first polysilicon layer on the first gate oxide layer;
forming a resistor portion on the substrate, the resistor portion including a second gate oxide layer and a second polysilicon layer on the second gate oxide layer, wherein the resistor portion is disposed at a substantially same height from an upper surface of the substrate as the first and the second gate stack portion;
covering the resistor portion with a photoresist without covering the gate stack portion;
removing a first portion of the first polysilicon layer from the gate stack portion;
removing the photoresist from the resistor portion; and
after removing the photoresist from the resistor portion, removing a remaining portion of the first polysilicon layer from the gate stack portion.

19. The method for manufacturing the semiconductor device according to claim 18, wherein removing the first portion of the first polysilicon layer comprises etching using at least one of ammonia, tetramethyl ammonium hydroxide (TMAH), and tetraethylammonium hydroxide (TEAH).

20. The method for manufacturing the semiconductor device according to claim 18, wherein removing the remaining portion of the first polysilicon layer from the gate stack portion comprises performing an ashing process.

21. The method for manufacturing the semiconductor device according to claim 20, wherein a portion of the second polysilicon layer is removed from the resistor portion during the ashing process.

22. The method for manufacturing the semiconductor device according to claim 21, further comprising:

depositing a first dielectric layer on the substrate adjacent and between the gate stack portion and the resistor portion;

depositing a high-K dielectric material on exposed portions of the substrate, including the first dielectric layer, the first gate oxide layer and the second polysilicon layer; and depositing a metal on the high-K dielectric layer.

23. The method for manufacturing the semiconductor device according to claim 22, further comprising:

performing a chemical mechanical polishing to remove the high-K dielectric material, and the metal from a top surface of the semiconductor device, and to planarize the top surface of the semiconductor device.

24. The method for manufacturing the semiconductor device according to claim 23, further comprising:

depositing a second dielectric layer on the planarized top surface of the substrate;

performing an open mask process to remove the first and second dielectric layers from areas between the gate stack portion and the resistor portion, and over the second polysilicon layer; and forming a silicide layer on portions of the substrate between the gate stack portion and the resistor portion, and on the second polysilicon layer.

\* \* \* \* \*